(12) United States Patent
Wang

(10) Patent No.: US 6,808,994 B1
(45) Date of Patent: Oct. 26, 2004

(54) TRANSISTOR STRUCTURES AND PROCESSES FOR FORMING SAME

(75) Inventor: Zhongze Wang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/463,159

(22) Filed: Jun. 17, 2003

(51) Int. Cl.[7] .......................................... H01L 21/336
(52) U.S. Cl. ............................................. 438/294
(58) Field of Search ................. 438/294, 290, 438/296, 318

(56) References Cited

U.S. PATENT DOCUMENTS 6,174,754 B1 * 1/2001 Lee et al. .................. 438/142
6,548,383 B1    4/2003 Trivedi et al. .............. 438/532

OTHER PUBLICATIONS

"Pseudo–SOI: P–N–P Channel–Doped Bulk MOSFET for Low–Voltage High–Speed Applications", M. Miyamoto et al., IEE Transactions on Electron Devices, vol. 48, No. 12. Dec. 2001. Pp. 2856–2860.

* cited by examiner

Primary Examiner—David Nelms
Assistant Examiner—Quoc Hoang

(57) ABSTRACT

Source drain on insulator (SDOI) transistors and methods of forming SDOI transistors are described. The SDOI transistors are formed to provide electrical isolation between the body and the channel of the transistor. The electrical isolation comprises either a depletion layer or a p-n junction formed below the SDOI transistor channel region that spans laterally between the SDOI insulators.

20 Claims, 9 Drawing Sheets

TRANSISTOR STRUCTURES AND PROCESSES FOR FORMING SAME

FIELD OF THE INVENTION

This invention relates to a semiconductor device and fabrication thereof and, more particularly, to Source-Drain On Insulator (SDOI) transistor structures and fabrication methods thereof.

BACKGROUND OF THE INVENTION

Semiconductor devices utilize Source-Drain On Insulator (SDOI) transistors for various applications. An SDOI transistor is a high performance transistor that has a very low junction capacitance, comparable to that of a Silicon On Insulator (SOI) transistor, but doesn't possess a floating body effect that is prevalent in SOI transistors.

The floating body effect of an SOI transistor has some advantages and some disadvantages. On the positive side, it results in higher current drive and better substrate-threshold voltage ($V_T$) swing (body effect is defined as $V_T$ sensitivity to body voltage drop (Vb)). On the negative side it can result in history effect and high off-state current leakage. It is advantageous to use SOI transistors on circuits that need high current drive and are tolerant to off-state current leakage. However, for other circuits, such as pass gate logic, the floating body effect will cause problems.

One example of the undesirable operations the floating body effect may cause in a pass logic gate may be seen in an example wherein: Vc equals the control voltage, Vt equals the transistor threshold voltage, and Vb equals the body voltage. During the "on" state the gate is at Vc, the source is at Vc, the drain is at Vc–$V_T$, and the body is at approximately Vc–$V_T$. When the device is switched to the "off" state, the gate goes to zero volts, the source stays at Vc and the body goes to Vb~Vc/2 (i.e., the history effect). When the drain switches to zero volts, the n+ junction between the source and the body becomes forward biased and will draw large bipolar current (i.e., undesirable high current drive).

The present invention addresses various characteristics of devices, such as an SOI transistor, and particularly addresses such issues as history effect and high current drive. A significant focus of the present invention comprises SDOI field effect transistor structures and fabrication methods thereof, which will become apparent to those skilled in the art from the following disclosure.

SUMMARY OF THE INVENTION

An exemplary implementation of the present invention includes source-drain on insulator (SDOI) transistor structures (n-channel and p-channel transistor structures) comprising a buried depletion layer under the channel region, which provides electrical isolation between the body and the channel of each transistor structure.

Another exemplary implementation of the present invention include source-drain on insulator (SDOI) transistor structures (n-channel and p-channel transistor structures) comprising a buried p-n junction under the channel region, which provides substantial (if not complete) electrical isolation between the body and the channel of each transistor structure.

In one exemplary implementation, an SDOI transistor structure is formed by creating electrical isolation below the SDOI transistor channel region that spans completely between the SDOI insulators. The electrical isolation may be formed by implanting an appropriate conductive dopant to form a depletion layer below the channel region.

In an alternate exemplary implementation, the electrical isolation may be formed by implanting an appropriate conductive dopant to form a p-n junction below the channel region of an SDOI transistor structure that spans completely between SDOI insulators.

DETAILED DESCRIPTION OF THE INVENTION

The following exemplary implementations are in reference to SDOI transistor structure and the fabrication thereof in a semiconductor assembly. While the concepts of the present invention are conducive to the fabrication of an SDOI transistor for a semiconductor logic device the concepts taught herein may be applied to other semiconductor devices that would likewise benefit from the use of the SDOI transistor structure and processes disclosed herein. Therefore, the depictions of the present invention in reference to a pass SDOI transistor structure or a semiconductor logic device SDOI transistor structure and the manufacture thereof, are not meant to so limit the extent to which one skilled in the art may apply the concepts taught hereinafter.

In the following description, the terms "wafer" and "substrate" are to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in or over the base semiconductor structure or foundation. In addition, the semiconductor need not be silicon-based, but could be based on silicon-germanium, silicon-on-insulator, silicon-on-saphire, germnanium, or gallium arsenide, among others.

Figure 1:
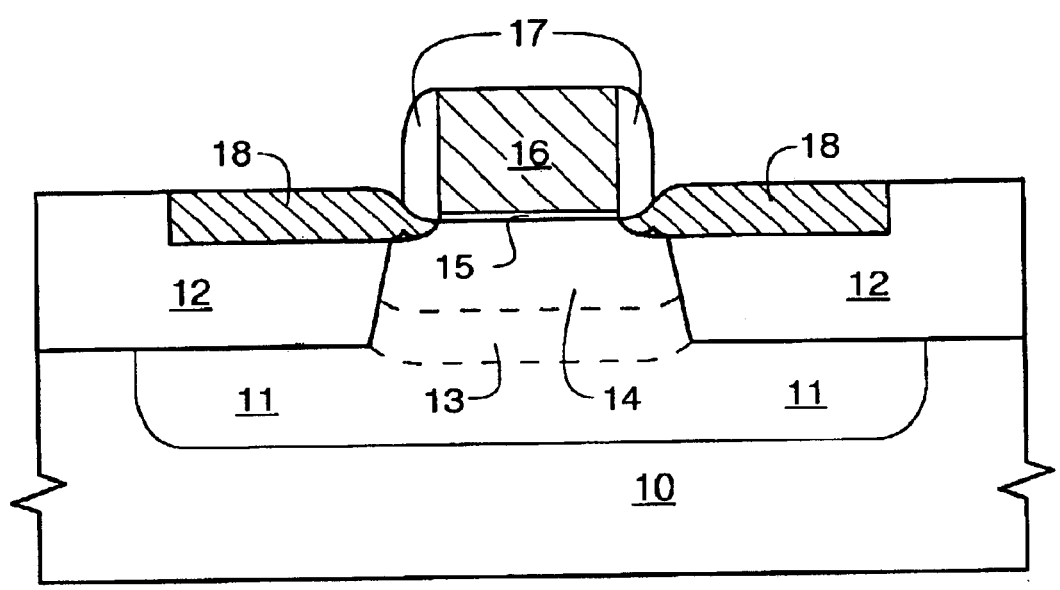
FIG. 1 is a cross-sectional view of a semiconductor substrate section showing an example of a completed SDOI transistor structure of the present invention.

FIG. 1 depicts an example of an embodiment of a completed Source-Drain On Insulator (SDOI) transistor structure of the present invention. Referring now to FIG. 1, a semiconductor substrate 10 has a conductive Well 11 implanted therein. A transistor gate 16, formed from a conductive material overlies gate oxide 15. In channel region 14, an underlying depletion layer or a p-n junction (region 13) spans between the bottom surfaces of the shallow trench isolation material 12. Implanted source-drain regions (electrodes) 18 are formed from amorphous silicon and epitaxial silicon and transistor gate spacers 17 isolate the vertical sidewalls of transistor gate 16. The fabrication methods to form variations of the Source-Drain On Insulator (SDOI) transistor structure of the present invention now follow.

Figure 2:
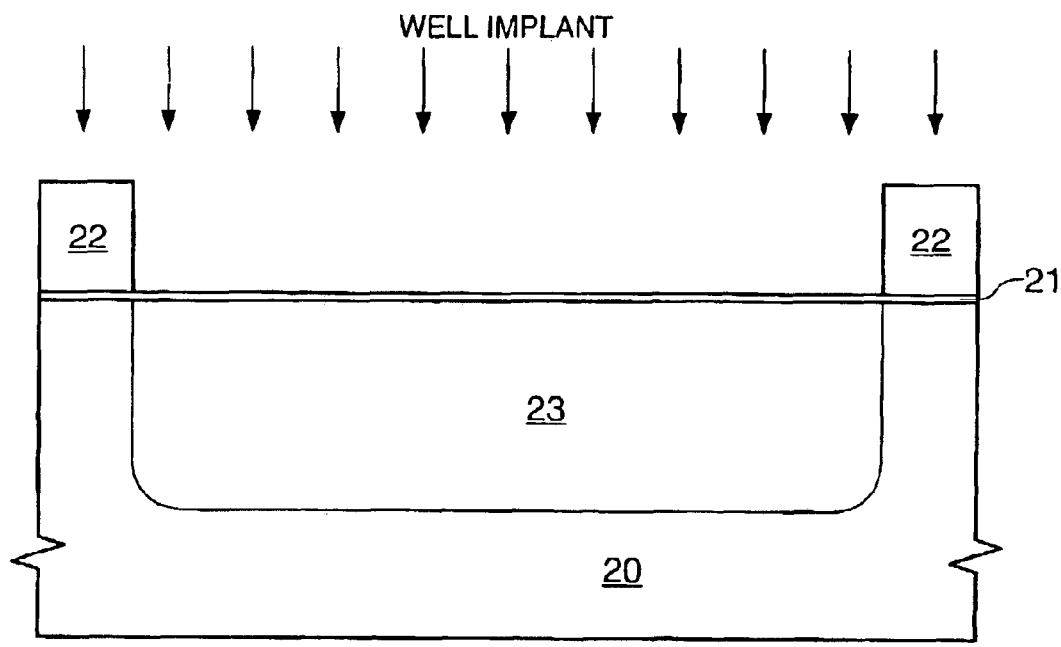
FIG. 2 is a cross-sectional view of a semiconductor substrate section showing the early stages of an SDOI transistor following a PWell implant and a PWell drive into a P type substrate.

A first exemplary fabrication of an embodiment the present invention is depicted in FIGS. 2–9. Referring now to FIG. 2, oxide layer 21 is formed over semiconductive substrate 20, such as a p-type silicon substrate. Oxide layer 21 acts as a buffer from subsequent p or n-type conductive Well implants. Mask layer 22, such as a photoresist, is placed to define a subsequently formed conductive Well. In this example, a p-type implant is performed, such as a Boron implant, to form PWell 23. For example, with an oxide 21 thickness of approximately 90 Angstroms, an effective PWell implantcomprises a series of Boron implants, including a first Boron implant dose of approximately $5 \times 10^{12}$ Atoms/cm$^2$, with an implant energy of approximately 25 KeV, a second Boron implant dose of approximately $1 \times 10^{12}$ Atoms/cm$^2$, with an implant energy of approximately 100 KeV and a third Boron implant dose of approximately $3 \times 10^{12}$ Atoms/cm$^2$, with an implant energy of approximately 180 KeV.

Figure 3:
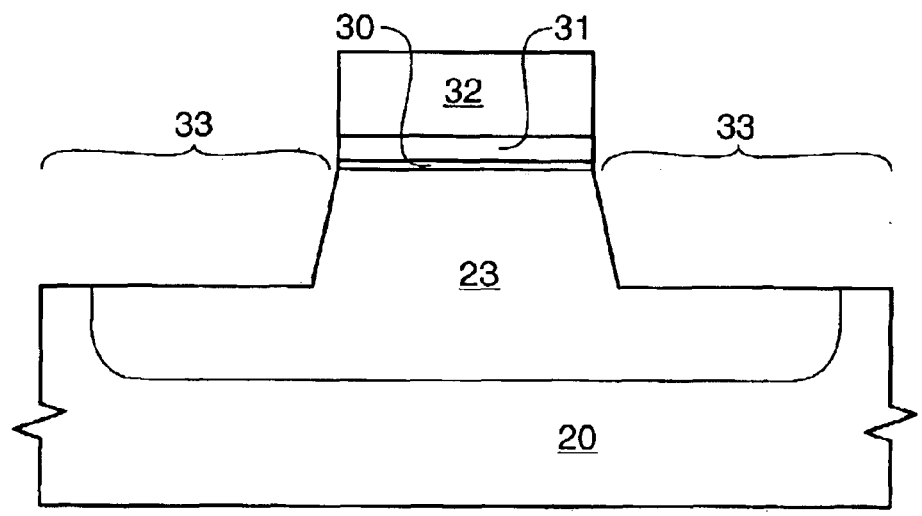
FIG. 3 is a subsequent cross-sectional view taken from FIG. 2 following a patterning of nitride, a trench etch into the PWell region.

Referring now to FIG. 3, oxide layer 21 has been stripped and a quality gate oxide layer 30 is grown on semiconductive substrate 20, followed by the deposition of nitride layer 31, having a thickness of anywhere from 500–900 Angstroms. Next, photoresist 32 is placed, patterned and then etched along with exposed portions of nitride 31 to define the active area of a SDOI transistor structure. During this etch, shallow trenches 33 are formed into semiconductor substrate 20. A preferred depth of trenches 33 is approximately 3000 Angstroms and an etch using CF$_4$, at flow rate of 40 sccm and temperature of 70° C., for a time duration of approximately 10 seconds, is sufficient to obtain the desired trench depth.

Figure 4:
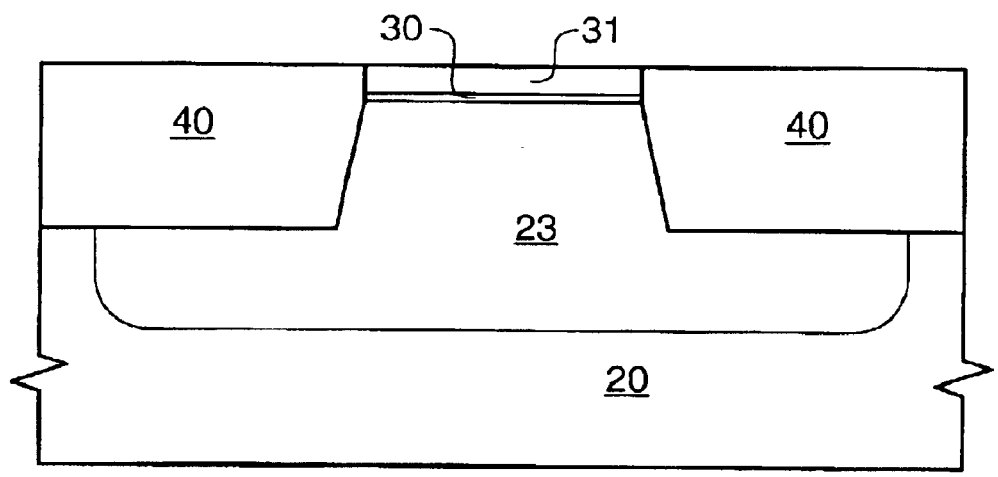
FIG. 4 is a subsequent cross-sectional view taken from FIG. 3 following the formation of oxide to define a source-drain location over oxide for an SDOI transistor.

Referring now to FIG. 4, an insulation material 40, such as oxide, is deposited and planarized down to the surface of nitride 31 to form the insulation component (i.e., trench isolation material) of the SDOI transistor structure.

Figure 5:
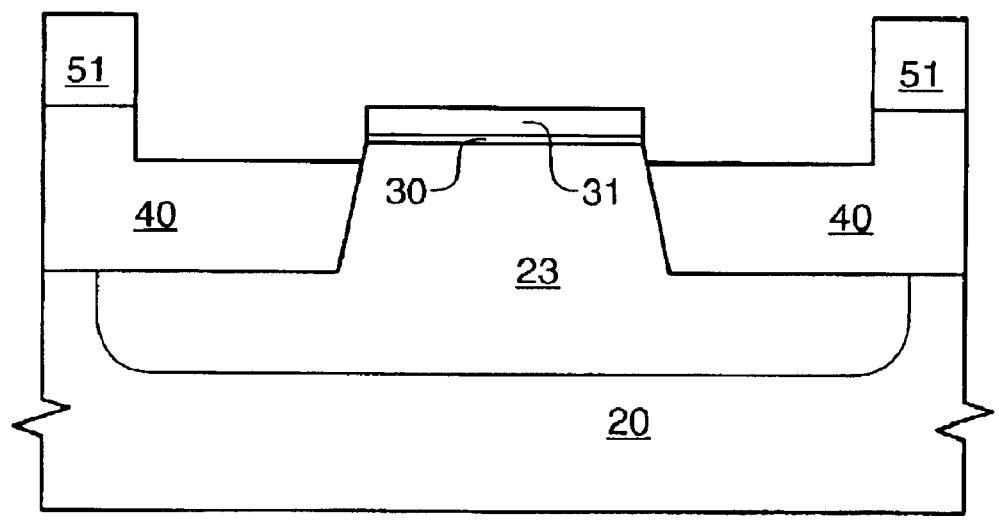
FIG. 5 is a subsequent cross-sectional view taken from FIG. 4 following the patterning and etching of oxide component of the SDOI transistor.

Referring now to FIG. 5, photoresist 51 is placed and patterned, which is followed by oxide 40 being etched selective to nitride 31 in order to recess oxide 40 below the lower level of nitride 31 to expose the silicon of PWell 23. For example, an etch using C$_4$F$_6$, at flow rate of 8 sccm and temperature of 70° C. For a time period of approximately 20 seconds will recess oxide 40 to leave approximately 2000 Angstroms of oxide 40. Photoresist 51 is then stripped.

Figure 6:
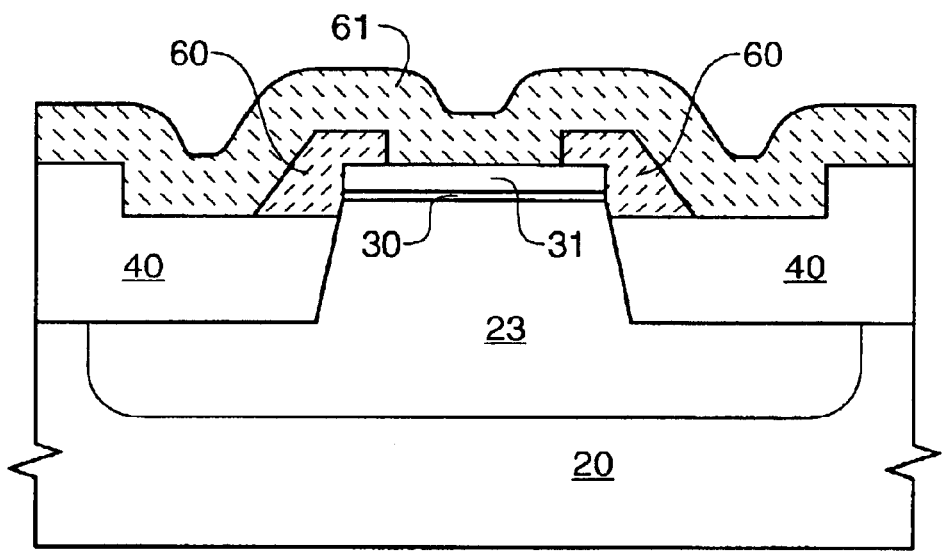
FIG. 6 is a subsequent cross-sectional view taken from FIG. 5 following the selective deposition of epitaxial silicon, followed by the deposition of amorphous silicon.

Referring now to FIG. 6, selective epitaxial silicon (epi) is deposited to form epi silicon structures 60. A silicon epi deposition to form silicon structures 60 may be accomplished by decomposing DCS (Si$_2$H$_2$Cl$_2$) in an H2 and HCl environment at 800 to 1000° C. A preferred silicon epi thickness is 500 to 1500 Angstroms.

After selective epi silicon deposition, amorphous silicon 61 is deposited to cover exposed oxide regions 40, epi silicon structures 60 and exposed nitride 31. An amorphous silicon deposition to form amorphous silicon layer 61 may be accomplished by decomposing SiH4 at approximately 500° C. A preferred amorphous silicon thickness is 2000 to 3000 Angstroms.

Figure 7:
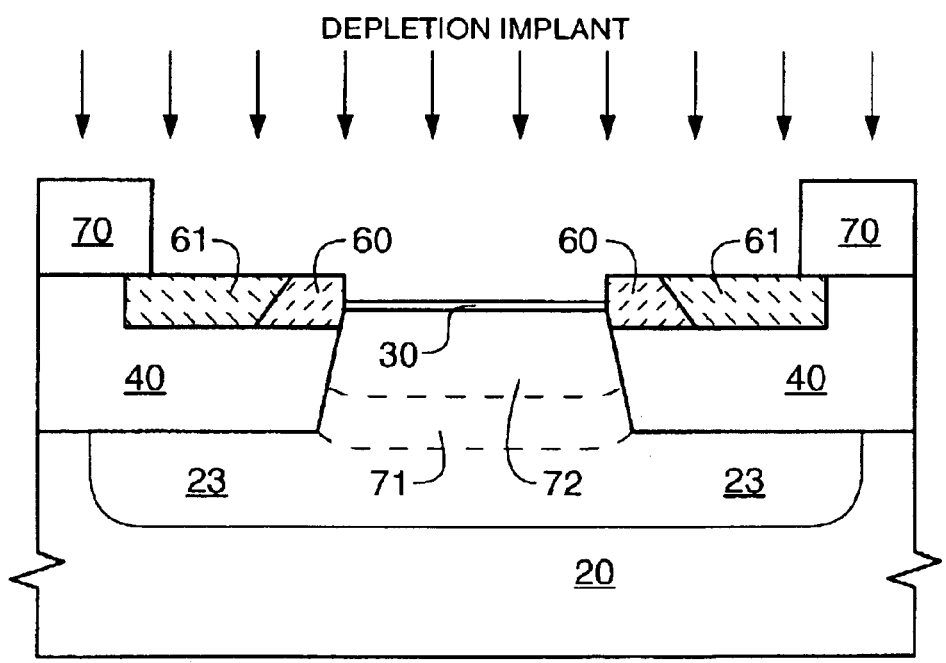
FIG. 7 is a subsequent cross-sectional view taken from FIG. 6 following the planarization of the epitaxial silicon and amorphous silicon, the removal of the patterned nitride, the placing and patterning of photoresist, followed by an n-depletion layer implant.

Referring now to FIG. 7, amorphous silicon 61 and epi silicon structures 60 are preferably planarized back to nitride.31 (seen in FIG. 5), such as using chemical mechanical Planarization (CMP). Planarized amorphous silicon 61 and planarized epi silicon structures 60 will become the source drain regions of the SDOI transistor structure following a subsequent sourcedrain implant. Next, nitride 31 is removed, such as by using a 125–150° C. Phosphorus acid etch to remove the nitride selective to silicon and oxide, to expose the underlying silicon of PWell 23.

Next, photoresist 70 is placed and patterned to allow for a following n-depletion layer implant to form n-depletion layer 71 at the base of and extending between oxide regions 40. N-depletion layer 71 serves an important function in this exemplary embodiment of the present invention as it provides electrical isolation between the transistor body (resident in PWell 23) and p-region 72. P-region 72 will function as the channel for the SDOI transistor structure.

N-depletion layer 71 functions properly when the depth of the n-depletion is such that it completely spans between laterally spaced oxide regions 40 and yet is sufficiently deep to avoid hindering proper operation of an overlying channel region. As an example of a preferred implementation of the present invention, performing an n-depletion implant into PWell 23, with oxide regions 40 having a thickness of approximately 2800 Angstroms, a Phosphorus implant dose of approximately $5 \times 10^{11}$ to $1 \times 10^{12}$ Atoms/cm$^2$, with an implant energy of approximately 180 KeV, will obtain the desired implant depth for the n-type depletion layer 71. In order to maintain an effective n-depletion layer 71, the thickness of oxide regions 40 should be in the order of 2500 Angstroms or greater.

The body to channel isolation provided by n-type depletion layer 71 improves the transistor's sub-threshold swing and reduces the substrate-bias coefficient. The improvement basically is accomplished by reducing the capacitive coupling between the transistor channel and the transistor body with the insertion of depletion capacitance therebetween by the depletion layer. The method is not dependent on channel length or the desired threshold voltage ($V_T$) of the finished transistor as the method is independent of the horizontal dimension of the device. Therefore, the method does not require an angled implant to adjust $V_T$ although if so desired, one may be performed without altering the effectiveness of n-depletion 71 spanning between the bottoms of the shallow trench isolation 40.

Figure 8:
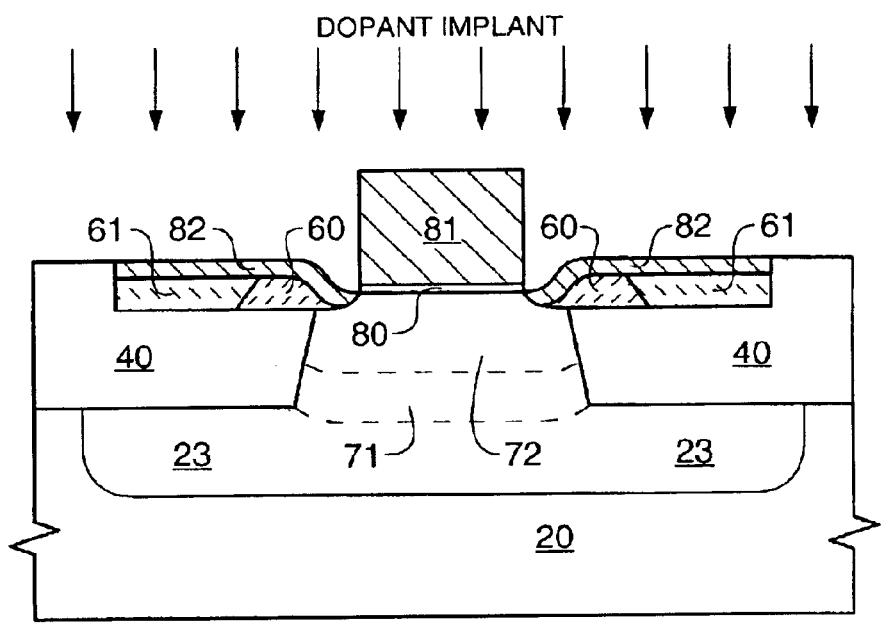
FIG. 8 is a subsequent cross-sectional view taken from FIG. 7 following the formation of an SDOI transistor gate and a self-aligned source-drain extension implant.

Referring now to FIG. 8, a conductive material, such as metal, conductive polysilicon or metal silicide, is formed, patterned and etched to form transistor gate 81 and an underlying gate oxide 80, by means known to those skilled in the art. Once gate 81 is formed and source-drain extension implant, such as an Arsenic (As) implant, to form an n-channel transistor, is performed to form source-drain extension regions 82 that are self-aligned to gate 81. One implant example is an As implant dose of approximately $2 \times 10^{14}$ Atoms/cm$^2$, with an implant energy of approximately 8 KeV. Because the As implant is very shallow, it will not connect to or alter the functionality of underlying n-depletion region 71.

Figure 9:
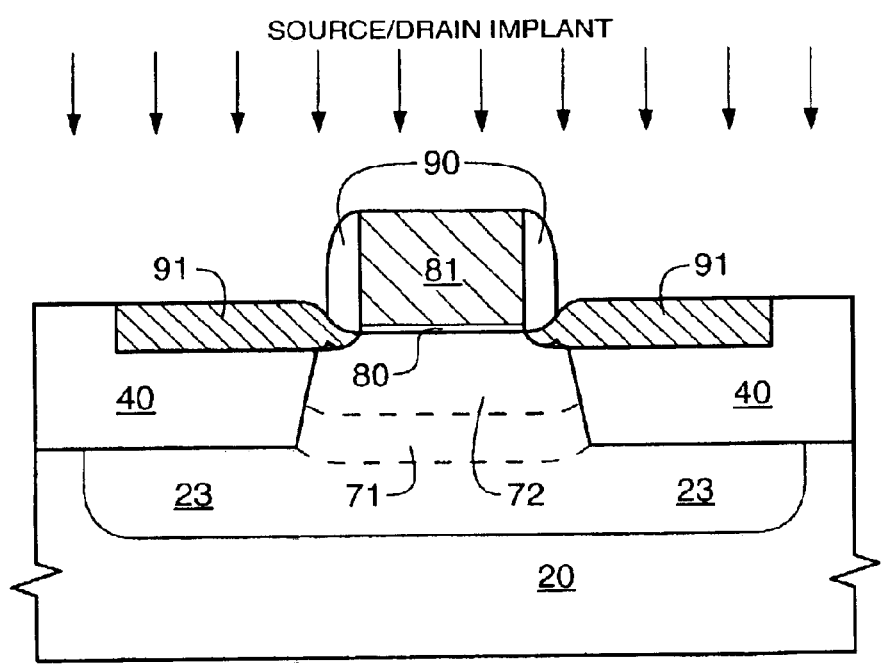
FIG. 9 is a subsequent cross-sectional view taken from FIG. 8 following the formation of SDOI transistor gate spacers followed by a source-drain implant to complete transistor formation.

Referring now to FIG. 9, transistor gate spacers 90 are formed followed by a sourcedrain implant, such as an Arsenic (As) implant dose of approximately $2 \times 10^{15}$ Atoms/cm$^2$, with an implant energy of approximately 15 KeV, to form source-drain regions (electrodes) 91 to complete the formation of a Source-Drain On Insulator (SDOI) transistor structure of the present invention. Fabrication methods known to those skilled in the art are then used to complete the processing of the semiconductor device.

Figure 10:
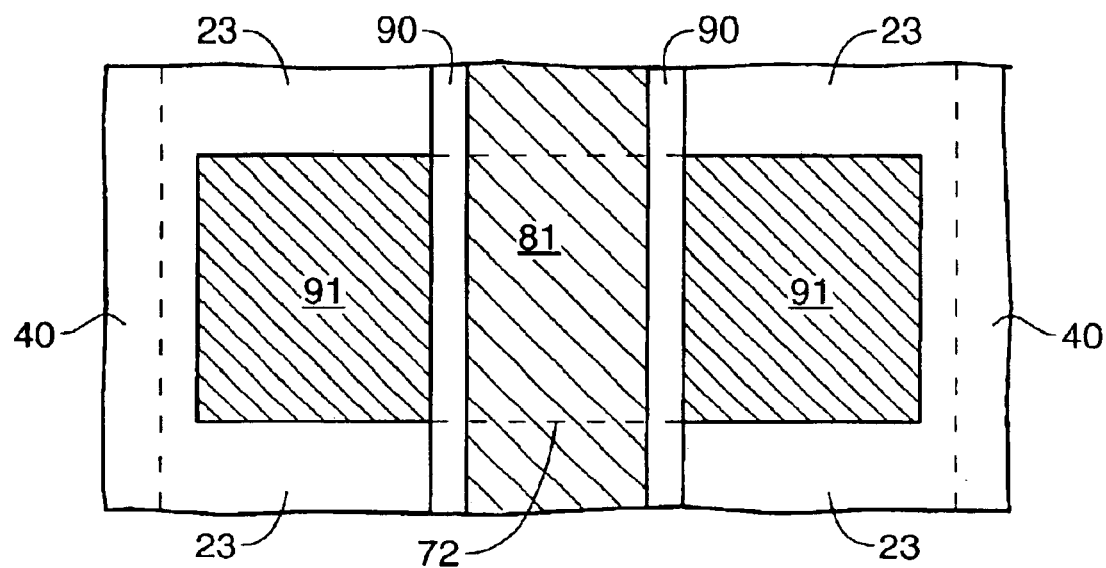
FIG. 10 is an overhead plan view of FIG. 9 showing a completed SDOI transistor structure of an embodiment of the present invention

FIG. 10 depicts an overhead view of a completed Source-Drain On Insulator (SDOI) transistor structure as described in the process steps taken in FIGS. 2-9. As shown in FIG. 10, underlying substrate 20 (not seen) has been implanted with conductive dopants to form PWell 23. Source/drain regions 91 are implanted into PWell 23 and the underlying channel region 72 is shown with dashed lines and underlies SDOI transistor gate 81. The sidewalls of SDOI transistor gate 81 are isolated by insulation spacers 90.

A second exemplary fabrication of an embodiment of the present invention is depicted in FIGS. 2-6 and FIGS. 11-13. This embodiment covers the case for selecting a p-type silicon substrate 20. In FIG. 2, an NWell implant is performed, such as an Arsenic or Phosphorus implant, to form NWell 23 into silicon substrate 20. An example of the NWell implant comprises a phosphorous implant of approximately $3 \times 10^{12}$ Atoms/cm$^2$; with an implant energy of approximately 150 KeV followed by a phosphorous implant of approximately $5 \times 10^{12}$ Atoms/cm$^2$, with an implant energy of approximately 360 KeV. In the case for selecting an n-type substrate the NWell implant does not need to be performed as will be discussed further in this-embodiment.

The process steps depicted in FIGS. 3-6 for the first exemplary implementation of the present invention are repeated in this second exemplary implementation of the present invention to develop the structure as depicted in FIG. 6. The process then continues with the process steps. depicted in FIGS. 11-13 as follows.

Figure 11:
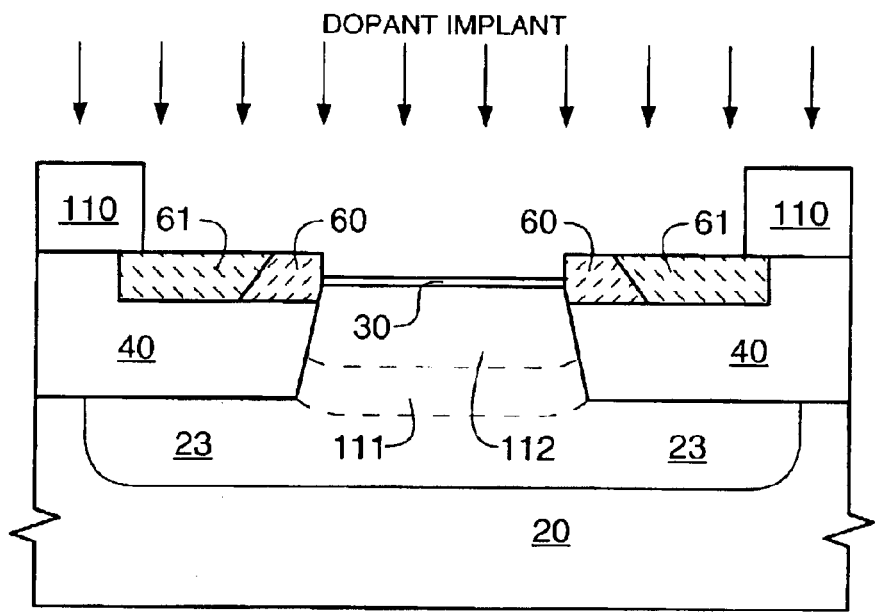
FIG. 11 is a subsequent cross-sectional view taken from FIG. 6 following the planarization of the epitaxial silicon and amorphous silicon, the removal of the patterned nitride, the placing and patterning of photoresist, followed by a PWell implant.

Referring now to FIG. 11, amorphous silicon 61 and epi silicon structures 60 are preferably planarized back to nitride 30 (seen in FIG. 6), such as using chemical mechanical Planarization (CMP). Planarized amorphous silicon 61 and planarized epi silicon structures 60 will become the source drain regions of the SDOI transistor structure following a subsequent source-drain implant. Next, nitride 30 is removed, such as by using a 125–150° C. Phosphorus acid etch to remove the nitride selective to silicon and oxide, to expose the underlying silicon of NWell 23. Next, photoresist 110 is placed and patterned to allow for a following PWell implant that forms p-n junction 111 at the base of and extending between laterally spaced oxide regions 40. P-n junction 111 serves an important function in this exemplary embodiment of the present invention as it provides electrical isolation between the transistor body (resident in NWell 23) and PWell region 112. PWell region 112 will function as a channel for the SDOI transistor structure.

The p-n junction functions properly when the depth of p-n junction 111 is such that it completely spans between laterally spaced oxide regions 40 and is also sufficiently deep to avoid hindering proper operation of an overlying channel region. For example, with oxide regions 40 having a thickness of approximately 2800 Angstroms, performing a PWell implant into NWell 23 requires a Boron implant dose of approximately $5 \times 10^{12}$ Atoms/cm$^2$, with an implant energy of approximately 30 KeV.

In the case of an n-type silicon substrate being selected (the NWell implant is not performed), once the PWell implant is performed a p-n junction will be formed at the base of and extending between laterally spaced oxide regions 40. The desired effect of the p-n junction is attained and the NWell implant is not necessary (though it may be implemented if so desired).

The body to channel isolation provided by p-n junction 111 improves the transistor's sub-threshold swing and reduces the substrate-bias coefficient. The improvement basically is accomplished by reducing the capacitive coupling between the transistor channel and the transistor body with the insertion of depletion capacitance therebetween by the p-n junction. The method is not dependent on channel length or the desired threshold voltage ($V_T$) of the finished transistor as the method is independent of the horizontal dimension of the device. Therefore, the method does not require an angled implant to adjust $V_T$, although if so desired, one may be performed without altering the effectiveness of p-n junction 111 spanning between the bottoms of the laterally spaced shallow trench isolation regions (oxide regions 40).

Figure 12:
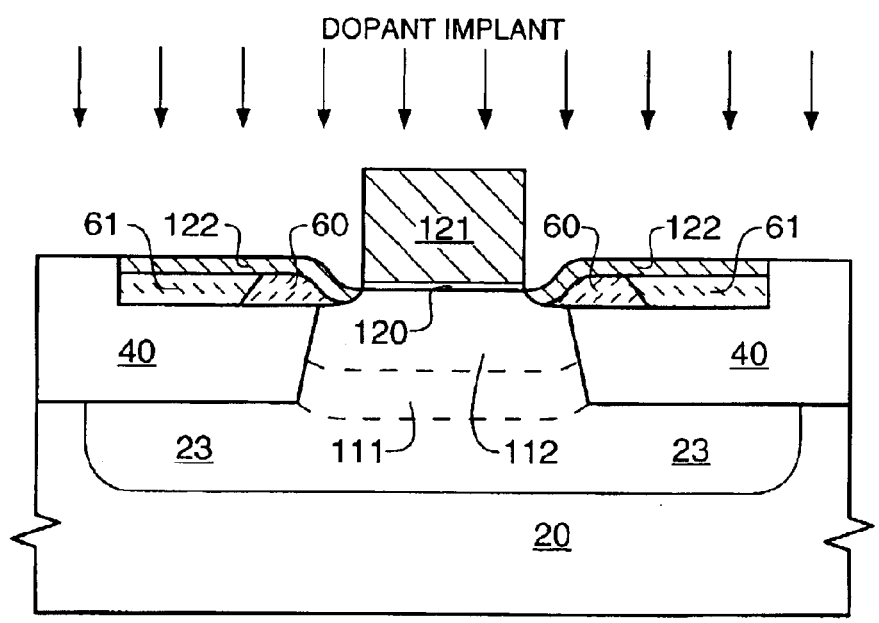
FIG. 12 is a subsequent cross-sectional view taken from FIG. 11 following the formation of an SDOI transistor gate and a self-aligned source-drain extension implant.

Referring now to FIG. 12, a conductive material, such as metal, conductive polysilicon and metal silicide, is formed, patterned and etched to form transistor gate 121 and underlying gate oxide 120, by means known to those skilled in the art. Once gate 121 is formed and source-drain extension implant, such as an Arsenic (As) implant to form an n-channel transistor, is performed to form source-drain extension regions 122 that are self-aligned to gate 121. One implant example is an As implant dose of approximately $2 \times 10^{14}$ Atoms/cm$^2$, with an implant energy of approximately 10 KeV. Because the As implant is very shallow it will not connect to or alter the functionality of underlying p-n junction 111 spanning between the bottom of the shallow trench isolation regions (oxide regions 40).

Figure 13:
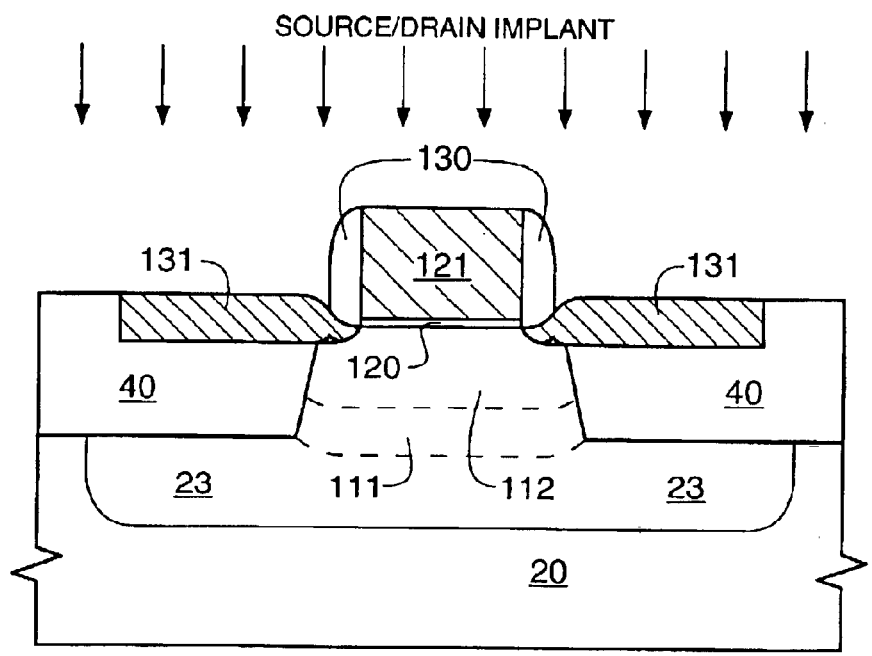
FIG. 13 is a subsequent cross-sectional view taken from FIG. 12 following the formation of SDOI transistor gate spacers followed by a source-drain implant to complete transistor formation.

Referring now to FIG. 13, transistor gate spacers 130 are formed followed by a source-drain implant, such as an Arsenic (As) implant dose of approximately $2 \times 10^{15}$ Atoms/cm$^2$, with an implant energy of approximately 15 KeV, to form source-drain regions (electrodes) 131 to complete the formation of a Source-Drain On Insulator (SDOI) transistor structure of the present invention. Fabrication methods known to those skilled in the art are then used to complete the processing of the semiconductor device.

Figure 14:
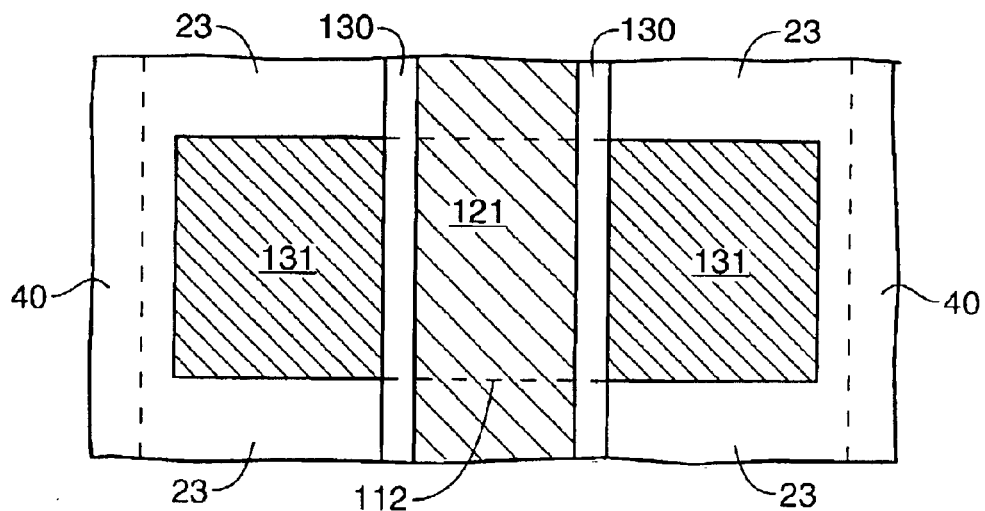
FIG. 14 is an overhead plan view of FIG. 13 showing a completed SDOI transistor of an embodiment of the present invention.

FIG. 14 depicts an overhead view of a completed Source-Drain On Insulator (SDOI) transistor structure as described in the process steps taken in FIGS. 2-6 and 11-13. As shown in FIG. 14, underlying substrate 20 (not seen) has been implanted with conductive dopants to form PWell 23. Source/drain regions 131 are implanted into PWell 23 and the underlying channel region 112 is shown with dashed lines and underlies SDOI transistor gate 121. The sidewalls of SDOI transistor gate 121 are isolated by insulation spacers 130.

The exemplary embodiments have been discussed in reference to forming n-channel SDOI transistor structures. However, these concepts, taught in the exemplary embodiments, may be utilized by one of ordinary skill in the art to form p-channel SDOI transistor structures as well, by simply replacing the implants with the proper type of doping implant. For example, in exemplary embodiment of FIGS. 2–6 and 11–13, the NWell implant demonstrated for FIG. 2 would be replaced with a PWell implant, the PWell implant demonstrated for FIG. 11 would be replaced with an NWell implant and the n-type source-drain implant demonstrated for FIG. 12 would be replaced with a p-type source-drain implant.

The completed SDOI transistor structure and the fabrication method used therefore may be for various types of devices, such as embedded memory devices, and may be used in numerous semiconductor applications and particularly in, but not limited to, DRAMs. For example, the present invention may be applied to a semiconductor system, such as the one depicted in FIG. 15, the general operation of which is known to one skilled in the art.

Figure 15:
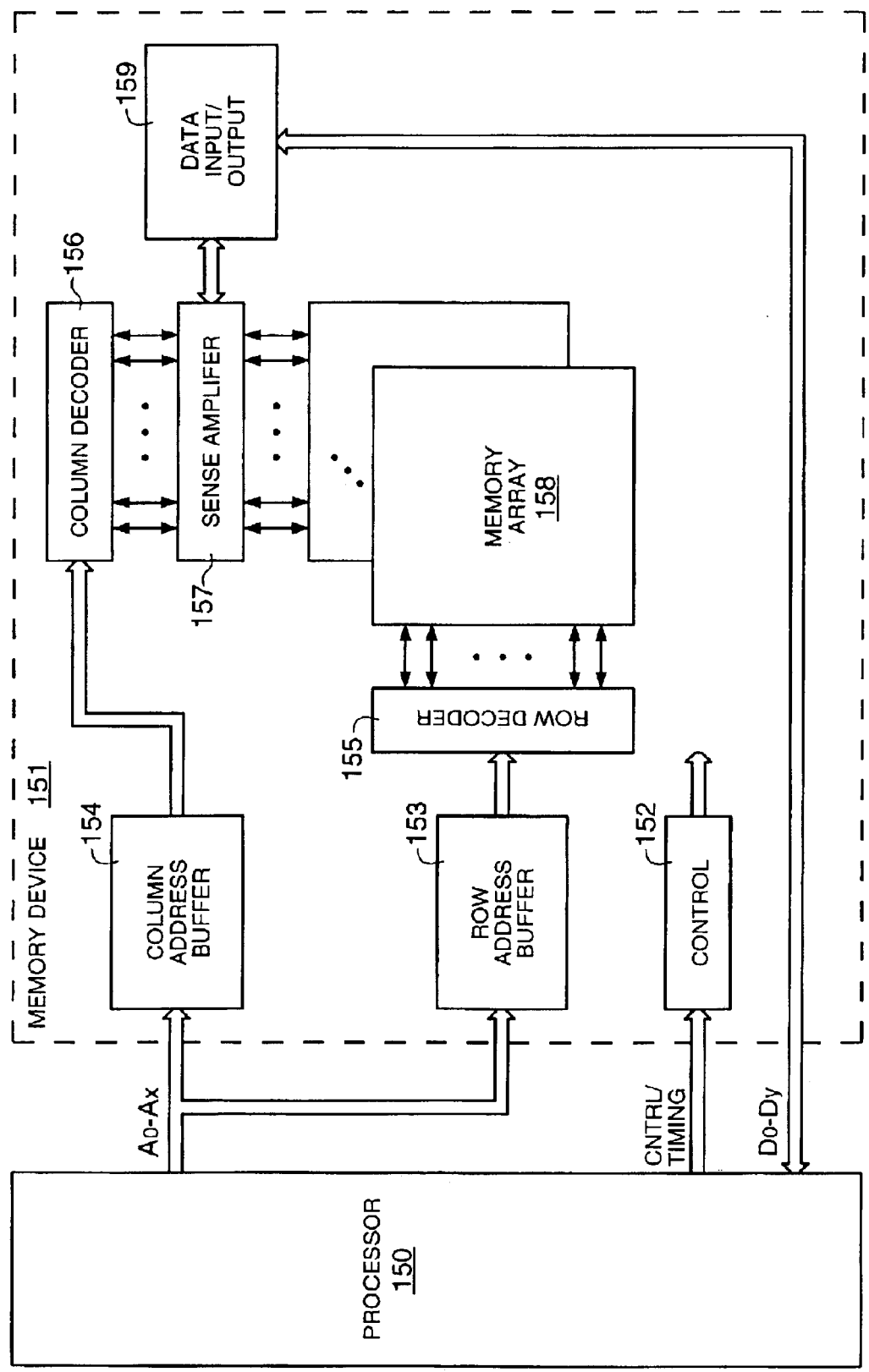
FIG. 15 is a simplified block diagram of a semiconductor system comprising a processor and memory device to which the present invention may be applied.

FIG. 15 represents a general block diagram of a semiconductor system comprising a processor 150 and a memory device 151 showing the basic sections of a memory integrated circuit, such as row and column address buffers, 153 and 154, row and column decoders, 155 and 156, sense amplifiers 157, memory array 158 and data input/output 159, which are manipulated by control/timing signals from the processor through control 152.

It is to be understood that, although the present invention has been described with reference to a preferred embodiment, various modifications, known to those skilled in the art, may be made to the disclosed structure and process herein without departing from the invention as recited in the several claims appended hereto.

What is claimed is:

1. A method of forming electrical isolation in a transistor structure for a semiconductor assembly during fabrication thereof comprising:
    forming laterally separated sections of insulative material into a conductively doped silicon substrate;
    forming silicon directly on the insulative material and the conductively doped silicon substrate;
    forming source-drain diffusion regions over the laterally separated sections of insulative material, the source-drain diffusion regions separated by a channel region in the conductively doped silicon substrate; and
    forming a conductive depletion region at the base of and spanning completely between the laterally separated sections of insulative material.

2. The method of claim 1, wherein forming laterally separated sections of insulative material comprises forming laterally spaced trench isolation structures.

3. The method of claim 1, wherein forming the source-drain diffusion regions comprises implanting the silicon with p-type or n-type conductive dopants.

4. The method of claim 1, wherein forming the silicon further comprises depositing epitaxial silicon followed by the deposition of amorphous silicon.

5. The method of claim 1, wherein forming the conductive depletion region comprises implanting an appropriate conductive dopant type into the conductively doped silicon substrate such that the conductive depletion region forms below the channel region.

6. The method of claim 1, wherein the conductively doped silicon substrate comprises p-type conductivity, the source-drain diffusion regions comprise n-type conductivity, the channel region comprises p-type conductivity and the conductive depletion region comprises n-type conductivity.

7. The method of claim 1, wherein forming the laterally separated sections of insulative material comprises forming an oxide having a thickness of approximately 2800 Angstroms.

8. The method of claim 7, wherein forming conductive depletion region comprises implanting Phosphorus at a dose of approximately $5 \times 10^{11}$ to $1 \times 10^{12}$ Atoms/cm$^2$, with an implant energy of approximately 180 KeV.

9. The method of claim 1, wherein forming the laterally separated sections of insulative material comprises forming an oxide having a thickness of approximately 2500 Angstroms or greater.

10. The method of claim 1, wherein the conductively doped silicon substrate comprises n-type conductivity, the sourcedrain diffusion regions comprise p-type conductivity, the channel region comprises n-type conductivity and the conductive depletion region comprises p-type conductivity.

11. A method of forming a source-drain on insulator transistor structure for a semiconductor assembly during fabrication thereof comprising:
    forming source-drain diffusion regions of conductively doped silicon on laterally separated sections of insulative material and making contact to a conductively doped silicon substrate, the source-drain diffusion regions separated by a channel region in the conductively doped silicon substrate; and
    forming a p-n junction at the base of and spanning completely between the laterally separated sections of insulative material.

12. The method of claim 11, wherein forming source-drain diffusion regions of conductively doped silicon comprises implanting the silicon with p-type or n-type conductive dopants.

13. The method of claim 11, wherein forming silicon further comprises depositing epitaxial silicon followed by the deposition of amorphous silicon.

14. The method of claim 11, wherein forming a p-n junction comprises implanting an appropriate conductive dopant type into the conductively doped silicon substrate such that a p-n junction forms below the channel region.

15. The method of claim 11, wherein the conductively doped silicon substrate comprises p-type conductivity, the source-drain diffusion regions comprise n-type conductivity, the channel region comprises p-type conductivity.

16. The method of claim 11, wherein the conductively doped silicon substrate comprises n-type conductivity, the sourcedrain diffusion regions comprise p-type conductivity, the channel region comprises n-type conductivity.

17. The method of claim 11, further comprising forming the conductively doped silicon substrate by performing a first NWell implant comprising a phosphorous implant of approximately $3 \times 10^{12}$ Atoms/cm$^2$, with an implant energy of approximately 150 KeV, followed by a second NWell implant comprising a phosphorous implant of approximately $5 \times 10^{12}$ Atoms/cm$^2$, with an implant energy of approximately 360 KeV.

18. The method of claim 11, wherein forming laterally separated sections of insulative material comprises forming an oxide having a thickness of approximately 2800 Angstroms.

19. The method of claim 18, wherein forming a p-n junction comprises implanting a Boron dose of approximately $5 \times 10^{12}$ Atoms/cm$^2$, with an implant energy of approximately 30 KeV.

20. The method of claim 11, wherein forming laterally separated sections of insulative material comprises forming an oxide having a thickness of approximately 2500 Angstroms or greater.

* * * * *